(12) United States Patent
Robbins

(10) Patent No.: US 8,901,603 B2
(45) Date of Patent: Dec. 2, 2014

(54) SURGE PROTECTION CIRCUIT FOR POWER MOSFETS USED AS ACTIVE BYPASS DIODES IN PHOTOVOLTAIC SOLAR POWER SYSTEMS

(71) Applicant: Steven Andrew Robbins, Calabasas, CA (US)

(72) Inventor: Steven Andrew Robbins, Calabasas, CA (US)

( * ) Notice: Subject to any disclaimer, the term of this patent is extended or adjusted under 35 U.S.C. 154(b) by 134 days.

(21) Appl. No.: 13/851,253

(22) Filed: Mar. 27, 2013

(65) Prior Publication Data

US 2014/0291721 A1   Oct. 2, 2014

Related U.S. Application Data

(60) Provisional application No. 61/617,335, filed on Mar. 29, 2012.

(51) Int. Cl.
*H01L 29/74* (2006.01)
*H01L 27/02* (2006.01)

(52) U.S. Cl.
CPC ........ *H01L 27/0266* (2013.01); *H01L 27/0259* (2013.01)

USPC .................... 257/140; 257/134; 257/355

(58) Field of Classification Search
USPC .................................. 257/140, 134, 355
See application file for complete search history.

(56) References Cited

U.S. PATENT DOCUMENTS

| | | |
|---|---|---|
| 5,559,659 A | 9/1996 | Strauss |
| 5,946,177 A | 8/1999 | Miller et al. |
| 6,744,611 B2 | 6/2004 | Yang et al. |
| 7,898,114 B2 | 3/2011 | Schmidt et al. |
| 8,169,252 B2 | 5/2012 | Fahrenbruch et al. |
| 8,233,252 B2 | 7/2012 | Grombach et al. |
| 2009/0014050 A1 | 1/2009 | Haaf |
| 2010/0002349 A1 | 1/2010 | La Scala et al. |

*Primary Examiner* — Long Pham

(57) ABSTRACT

A protection circuit for metal-oxide-semiconductor field-effect transistors (MOSFETs) that are used as active bypass diodes in photovoltaic solar power systems is disclosed. The protection circuit comprises, a detection circuit for detecting the start of a surge event, a switch disposed to connect the MOSFET's drain to it's gate in response to the start of the surge, a diode in series with the switch, a bistable circuit for keeping the switch closed during the surge, and a means of resetting the bistable circuit after the surge.

3 Claims, 3 Drawing Sheets

SURGE PROTECTION CIRCUIT FOR POWER MOSFETS USED AS ACTIVE BYPASS DIODES IN PHOTOVOLTAIC SOLAR POWER SYSTEMS

This application claims priority from U.S. Provisional Patent Application No. 61/617,335, filed on 29 Mar. 2012.

BACKGROUND

The invention relates generally to the field of photovoltaic (PV) solar power systems, and more specifically to circuits for protecting PV active bypass circuits from damage caused by electrical surges.

FIG. 1 is a high level block diagram of a conventional PV solar power system 10 including a plurality of PV subsections 11 connected in series. Each PV subsection 11 comprises a plurality of PV cells that are serially connected between a positive terminal 12 and a negative terminal 13. For example, a typical PV subsection includes twenty four PV cells, and produces about 12V between 12 and 13 in full sunlight. An inverter 15 converts the dc voltage to ac and has an output 16 for coupling to the electrical power grid. There is also usually a disconnect switch 17 for shutting down the system 10.

Since the PV subsections 11 are connected in series, the current is the same in each subsection. Therefore, when one subsection is shaded (e.g., by a tree branch, or chimney) it acts like a bottleneck, restricting current flow in the entire string. The unshaded PV subsections try to force current flow through the shaded subsection, resulting in the shaded subsection becoming reverse-biased. But a reverse-biased PV cell dissipates energy instead of producing energy, so the shaded subsection gets hot, and can even be permanently damaged. The well known remedy is to include bypass diodes 14 that allow current to flow around the shaded PV subsections, rather than through them. Thus, the bypass diodes 14 protect the PV subsections from damage due to reverse bias, and also avoid a serious reduction in system 10 efficiency when the string is partially shaded.

A common problem in PV systems, such as 10, is overheating in one or more of the bypass diodes 14. One solution is to replace the conventional bypass diodes 14 with active bypass circuits. There are many examples of such active bypass circuits in the prior art such as: U.S. Patent Application Publication number 2010/0002349 (La Scala, et al), U.S. Pat. No. 7,898,114 (Schmidt, et al), U.S. Patent Application Publication number 2009/0014050 (Haaf), and U.S. Patent Application Publication number 2011/0006232 (Fahrenbruch, et al).

FIG. 2 is a high level block diagram that is typical of such prior art, showing an active bypass circuit 20 comprising: a metal-oxide-semiconductor field-effect transistor (MOSFET) 22 with an integral body diode 21, and a power-supply/control circuit 24. When the PV subsection 11 is partially shaded, the string current initially flows through the MOSFET's body diode 21, creating a voltage ($V_{DS}$) of approximately −500 mV from drain 12 to source 13. The power-supply/control circuit 24 amplifies $V_{DS}$, producing approximately 5V between the MOSFET's gate 23 and it's source 13, thereby turning on the MOSFET 22 and reducing heat dissipation. When the PV subsection 11 is unshaded, the polarity of the drain-to-source voltage reverses, causing the power-supply/control circuit 24 to shut down and discharge the gate-to-source capacitance of the MOSFET 22, thereby turning off the MOSFET 22 again.

Another problem with conventional bypass diodes 14 is low reliability. For example, a 2012 report (Kato, et at) from Japan's Research Center for Photovoltaic Technologies (RCPVT) found that 47% of the 1272 solar power modules they examined, at a large PV installation called Mega-Solartown, had at least one failed bypass diode, after just eight years of service. And in 2010 an official report from the Solar American Board of Codes and Standards (www.solarabcs.org) stated " . . . undetected bypass diode failures may be an endemic industry-wide sleeper problem . . . ".

And yet, the PV industry still knows little about the true extent or causes of these bypass diode failures. One of the main suspected causes is electrical surges, which may destroy the diodes outright, or just weaken them, making them more susceptible to thermal runaway. There are at least two types of surges that can happen in PV systems: an inrush surge when the cutoff switch 17 is closed; and lightning-induced surges.

For example, FIG. 1 shows how a nearby lightning strike can induce current surges that damage or destroy bypass diodes 14. There are many places in the world where lightning strikes are frequent, and a lightning rod 6 is often placed in close proximity to a solar power array to prevent the lightning 5 from striking the array directly. The lightning discharge current $I_{DIS}$—which can easily exceed 40 kA—flows down the lightning rod 6 and into earth 8 via a ground wire 7. An intense magnetic field is formed around the wire 7. If the ground wire 7 comes close to a PV subsection 11, as shown at the bottom of FIG. 1, then some of the magnetic flux lines 9 can link the circuit loop consisting of the PV subsection 11 and the bypass diode 14, causing an induced current $I_{SURGE}$ to flow through the bypass diode 14.

$I_{SURGE}$ can exceed 200 A at it's peak, and can flow in either direction. If $I_{SURGE}$ flows through the bypass diode 14 in the forward direction, there is only a small voltage drop across the diode, typically 2V or less. However, if $I_{SURGE}$ flows through the bypass diode 14 in the reverse direction, the diode 14 goes into avalanche breakdown, and the voltage across the diode 14 is typically about 50V. So, reverse current flow is the worst case by far, because the diode 14 absorbs much more energy.

For example, assume the peak surge current is 200 A, and the avalanche voltage is 50V. Then the peak power in the diode 14 during the surge is (200 A)(50V)=10 kW. But the surge typically has an effective width of only about 20 μs, so the energy absorbed by the diode is roughly (20 μs)(10 kW)=200 mJ. The diode must absorb all the energy because the surge happens too quickly for heat to diffuse out through the diode's package, so heat-sinks are of no use in reducing the sudden spike in junction temperature. Consequently, the diode's junction temperature suddenly shoots up, as much as 70° C., possibly with catastrophic results. In fact, some Schottky diodes used for bypass in PV systems fail at only about 50 mJ avalanche energy.

Active bypass circuits such as 20 can usually absorb more energy than traditional Schottky bypass diodes, but not much. For example, low-cost MOSFETs used in active bypass circuits for PV systems typically have avalanche energy ratings of about 75 mJ to 100 mJ.

Therefore, there is a need in the solar power industry for a low-cost means of protecting MOSFETs in active bypass circuits against damage caused by electrical surges.

SUMMARY

The protection circuit disclosed herein turns on the MOSFET in a PV active bypass circuit at the beginning of a surge, and keeps it turned on until after the surge is ended. This greatly reduces the drain-to-source voltage during the surge, thereby greatly reducing the energy absorbed by the MOSFET.

Other features and advantages of the present invention disclosed herein will become apparent from the following more detailed description, when taken in conjunction with the accompanying drawings, which illustrate, by way of example, the principles of the invention.

BRIEF DESCRIPTION OF THE DRAWINGS

The accompanying drawings illustrate the invention. In such drawings.

DETAILED DESCRIPTION

Figure 1:
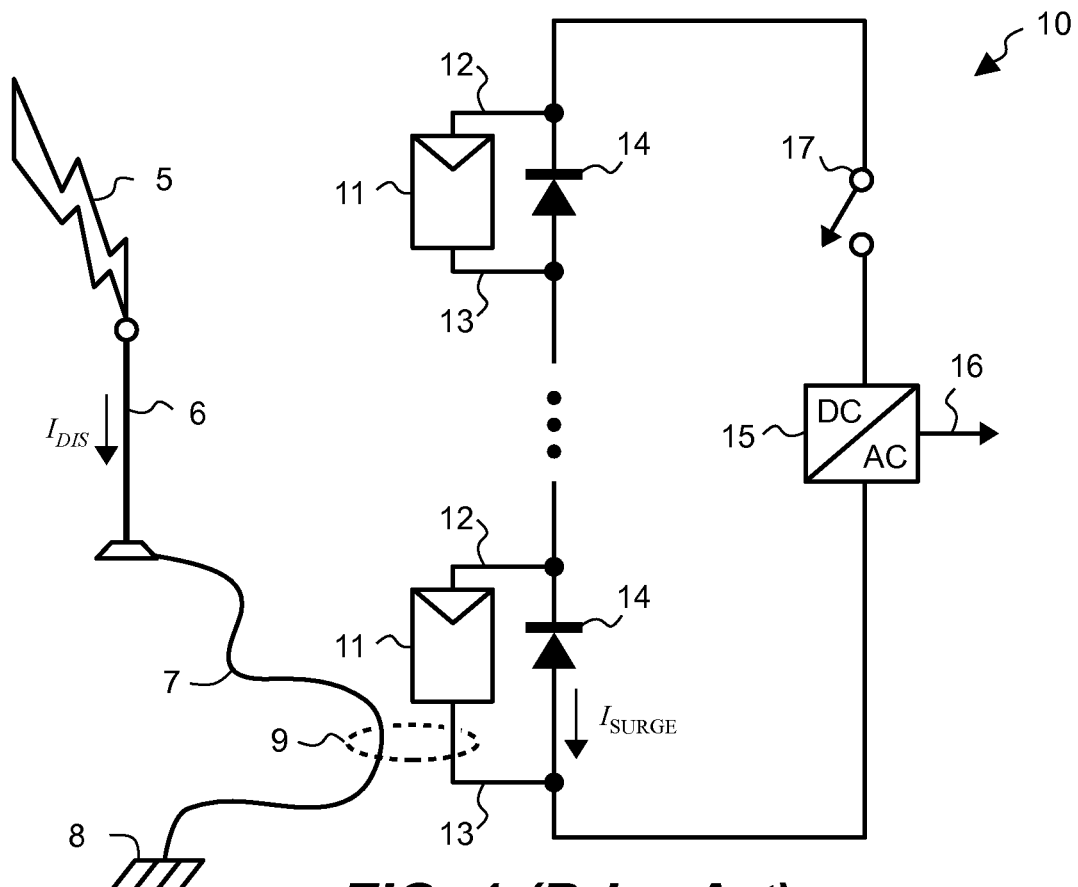
FIG. 1 is a high level block diagram of a conventional photovoltaic solar power system.
Figure 2:
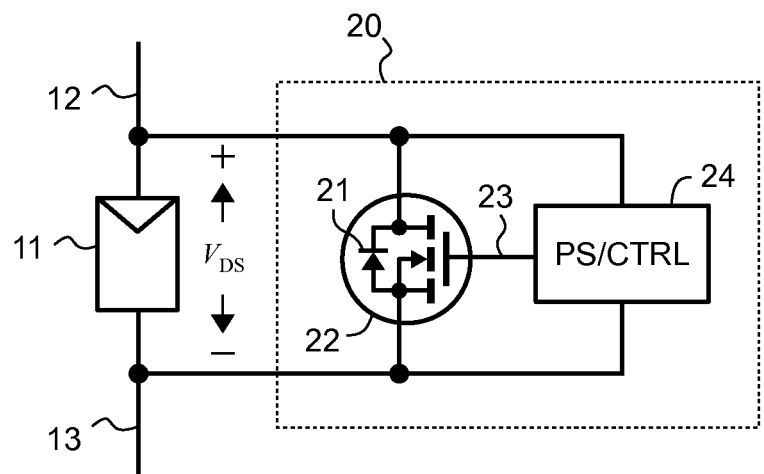
FIG. 2 is a high level block diagram of a conventional active bypass circuit.
Figure 3:
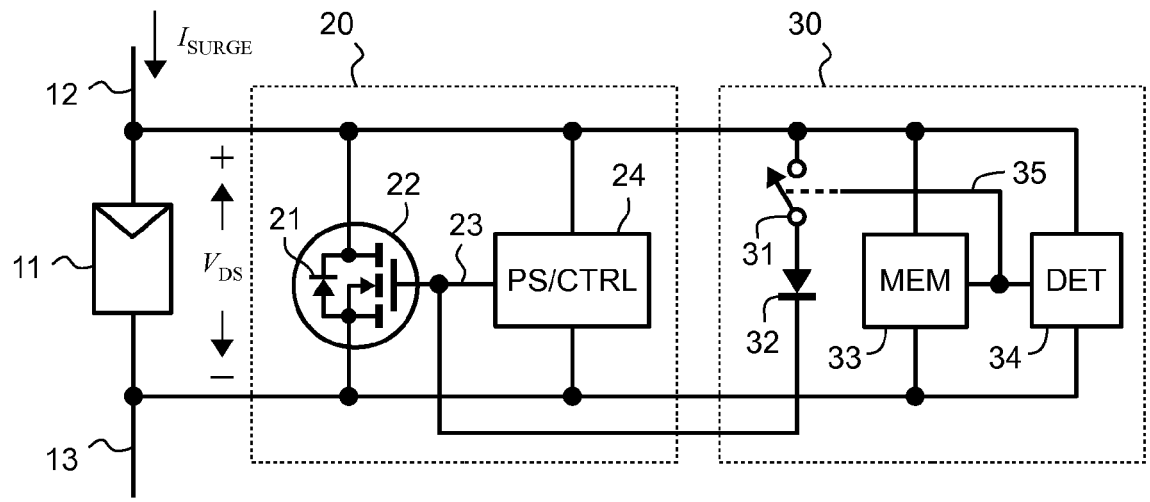
FIG. 3 is a high level block diagram of an active bypass circuit with the protection circuit disclosed herein.

FIG. 3 is a high level block diagram showing a subsection 11 of a PV array, with an active bypass circuit 20 that utilizes a power MOSFET 22, and a protection circuit 30 as disclosed herein. The protection circuit 30 comprises: a switch 31 that couples the MOSFET's 22 drain to it's gate when closed; a diode 32 in series with the switch 31; a bistable circuit 33 for controlling the switch 31; and a detection circuit 34 for setting the bistable circuit 33.

Figure 4:
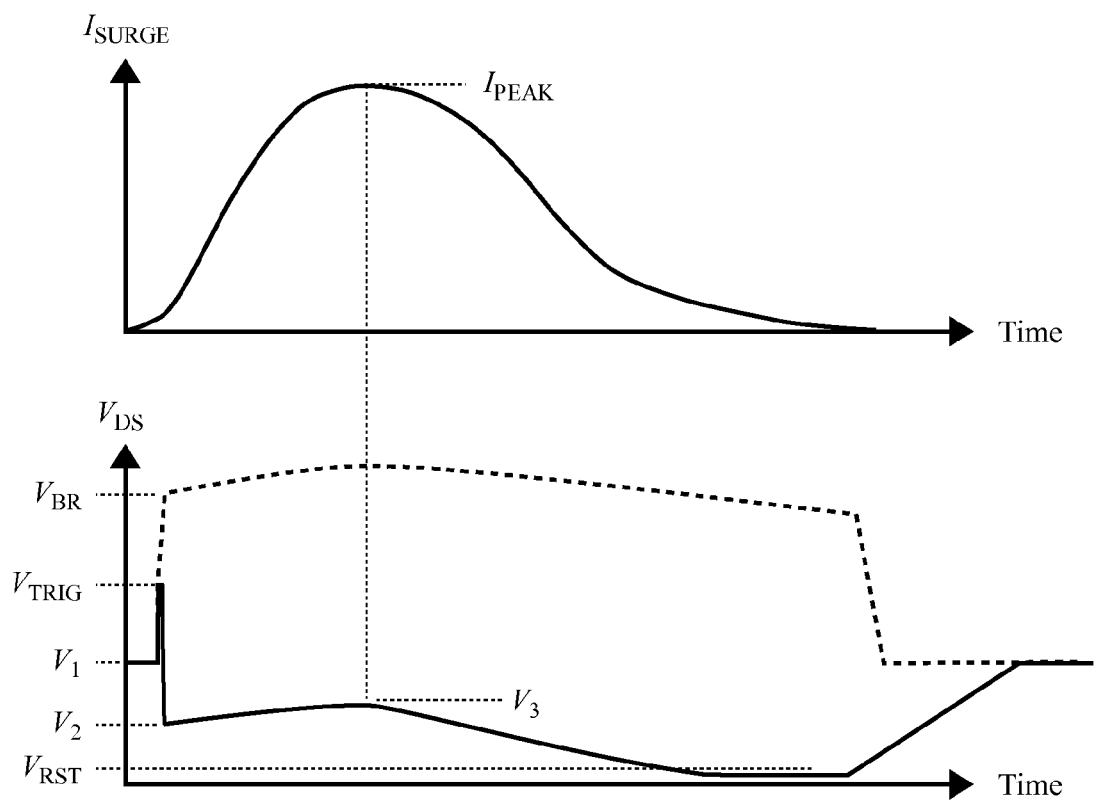
FIG. 4 shows example waveforms to illustrate the operation of the protection circuit.

FIG. 4 shows example waveforms to illustrate the operation of the protection circuit 30 and it's major advantages. The upper waveform is the surge current $I_{SURGE}$, consistent with the 8 µs/20 µs waveform shape defined in the IEC 61000-4-5 standard, which is commonly used to simulate a lighting strike. The lower waveforms show the drain-to-source voltage ($V_{DS}$) across the MOSFET 22 and protection circuit 30 resulting from $I_{SURGE}$.

$V_1$ is the initial value of $V_{DS}$ before the surge begins. When the lightning strike occurs at night $V_1$ is nearly zero since there is only star light or street lamps shining on the PV subsection 11. However, it is possible to have a lightning strike in the daytime, or some other kind of surge, such as an inrush surge when the cutoff switch 17 is closed. So $V_1$ could be as high as 12V.

The dashed voltage waveform is typical of an active bypass circuit 20 without the protection circuit 30. At the beginning of the surge, the MOSFET 22, begins to avalanche. $V_{DS}$ goes above the MOSFET's reverse breakdown voltage ($V_{BR}$) and stays there for the entire duration of the surge.

The solid voltage waveform is typical of the an active bypass circuit 20 with the protection circuit 30 disclosed herein. Once again, $V_{DS}$ shoots up at the beginning of the surge. But when $V_{DS}$ exceeds a first predetermined threshold ($V_{TRIG}$) the detection circuit 34 sets the bistable circuit 33 and closes the switch 31, thereby connecting the MOSFET's drain 12 to it's gate 23 via the diode 32. Thus, most of $V_{DS}$ is applied between the gate and source, thereby turning on the MOSFET 22. So the MOSFET 22 quickly pulls $V_{DS}$ down to $V_2$, which is typically 4V to 6V depending on the characteristics of the MOSFET and the magnitude of the surge current. $V_2$ is below $V_{TRIG}$ so the detection circuit 34 no longer asserts the switch's control signal 35, but the bistable circuit 33 keeps 35 asserted so the switch 31 stays closed.

The bistable circuit 33 keeps the switch 31 closed until it is reset in response to $V_{DS}$ falling below a second predefined threshold ($V_{RST}$). For example, after the peak, the current through the MOSFET 22 drops off rapidly, but the diode 31 acts like a peak detector, blocking the discharge of the MOSFET's 22 gate-to-source capacitance. If there is sunlight, the PV subsection 11 will try to keep $V_{DS}$ above about 10V, but a typical PV subsection 11 has a short-circuit current of less than 10 A, while the gate-to-source voltage of 22 is still large enough to sink $I_{PEAK}$. So the MOSFET 22 is able to pull $V_{DS}$ down to less than 100 mV typically, which is well below $V_{RST}$.

Thus, the power MOSFET 22, it's gate-to-source capacitance, and the diode 32 constitute a means for resetting the bistable circuit 33 in response to the drain-to-source voltage being relatively lesser than the second predefined voltage threshold, $V_{RST}$.

The affect the protection circuit 30 has, of reducing $V_{DS}$ during the surge, reduces the energy absorbed by the MOSFET 22, typically by up to 80% compared to the unprotected MOSFET represented by the dashed curve in FIG. 4.

Two exemplary embodiments of the protection circuit 30 will now be shown in more detail.

Figure 5:
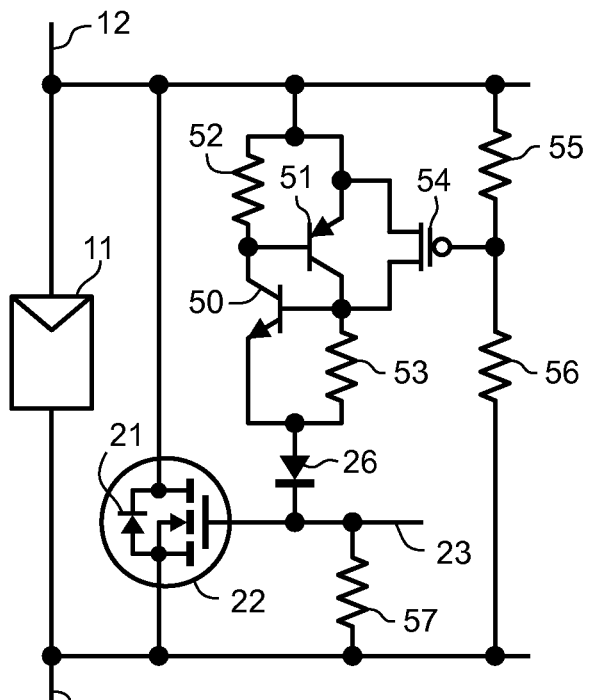
FIG. 5 is a simplified schematic diagram of a first exemplary embodiment of the protection circuit.

FIG. 5 shows a simplified schematic of a first exemplary embodiment of the protection circuit 30 wherein: items 54-56 constitute the detection circuit 34; items 26, 50, 51, and 57 constitute the bistable circuit 33; and items 50-53 also constitute the switch 31. In this first exemplary embodiment, $V_{TRIG}$ is the trigger transistor's 54 threshold voltage $V_T$, scaled-up by the resistive divider 55 and 56. For example, assume resistors 55 and 56 are 500 kΩ and 6.5MΩ respectively, and the $V_T$ of 54 is 1.3V; then $V_{TRIG}$=1.3(1+6.5/0.5)= 18.2V.

$V_{TRIG}$ is normally chosen to be in the 17V to 25V range for two reasons. First, to avoid false triggers $V_{TRIG}$ must be well above the maximum dc output voltage that the PV subsection 11 can produce in full sunlight, which is typically about 12V. And second, $V_{TRIG}$ must be well below the avalanche voltage of the MOSFET 22, which is typically 30V; otherwise, the MOSFET 22 could prevent the protection circuit 30 from triggering. MOSFETs with higher avalanche voltage are undesirable because they generally have higher on-resistance compared to 30V MOSFETs in the same price range.

The two bipolar transistors 50 and 51 form a Silicon Controlled Rectifier (SCR) which is a common type of thyristor, often used in integrated circuits for ESD protection. When the trigger transistor 54 is turned on, current flows into the base of the NPN transistor 50; this causes current to be pulled from the base of the PNP transistor 51, which then dumps more current into the base of the NPN 50, making a positive feedback loop that quickly saturates both 50 and 51. Emitter resistors 52 and 53 are often included in SCRs to avoid premature triggering due to leakage currents.

Once triggered by the detection circuit 54-56, the SCR stays in this saturated state after the trigger transistor 54 is turned off, until the current through the SCR drops below a critical threshold, and then it turns off. The load resistor 57 provides enough current flow through the diode 26, typically at least a few microamps, to keep the SCR from turning off until $V_{IN}$ falls below $V_{RST}$ at the end of the surge event. $V_{RST}$ is approximately the sum of the MOSFET's 22 gate-to-source voltage after the peak of the surge current, the diode 26 forward drop, and the collector-to-emitter saturation voltages of the bipolar transistors 50 and 51.

Figure 6:
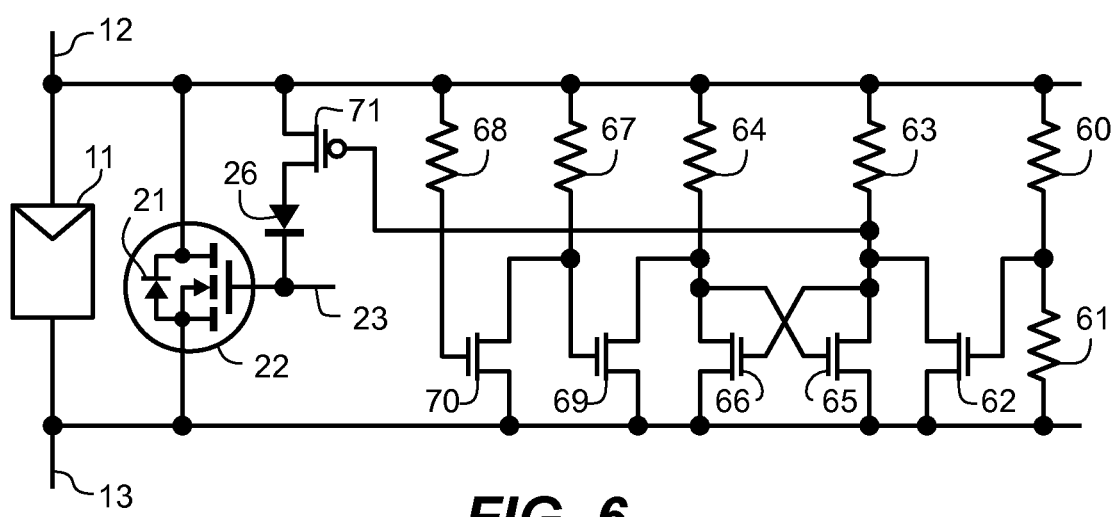
FIG. 6 is a simplified schematic diagram of a second exemplary embodiment of the protection circuit.

FIG. 6 shows a simplified schematic of a second exemplary embodiment of the protection circuit 30 wherein: items 60-62 constitute the detection circuit 34; items 63-66 constitute the bistable circuit 33; and the P-channel MOSFET 71 constitutes the switch 31. Additionally, items 67-70 form a reset circuit for resetting the bistable circuit 33 at power-up.

The bistable circuit 63-66 is a set/reset flip-flop comprising two cross-coupled N-channel FETs 65-66 and two pull-up resistors 63-64. One of ordinary skill in the art will understand that there are many other well known flip-flop circuit topologies that could be used alternatively, such as: cross-coupled P-channel FETs, cross-coupled bipolar transistors, cross-coupled NAND gates, or cross-coupled NOR gates.

Additionally, one of ordinary skill in the art will know that the switch 71 could also be implemented using a bipolar transistor, or even a junction field-effect transistor (JFET).

In the reset circuit, 69 has a threshold voltage that is relatively less than the threshold of 70. At start-up, as $V_{DS}$ increases from zero, 69 turns on first, thereby initializing the state of the bistable circuit 63-66. As $V_{DS}$ increases further 70 turns on, which turns 69 off, thereby enabling the bistable circuit 63-66 to be set by the detection circuit 60-62 in the event of a surge. Also, $V_{RST}$ is approximately equal to the threshold voltage of 70.

The detection circuit 60-62 in this second exemplary embodiment operates similarly to the detection circuit 54-56 from the first exemplary embodiment, only the trigger transistor 62 is N-channel instead of P-channel.

Although several embodiments have been described in detail for purposes of illustration, various modifications may be made to each without departing from the scope and spirit of the invention. Accordingly, the invention is not to be limited, except as by the appended claims.

What is claimed is:

1. A protection circuit for protecting a metal-oxide-semiconductor field-effect transistor from electrical surges, comprising:
   a switch for coupling the drain of the metal-oxide-semiconductor field-effect transistor to the gate of the metal-oxide-semiconductor field-effect transistor;
   a diode in series with the switch for preventing current flow from the gate of the metal-oxide-semiconductor field-effect transistor to the drain of the metal-oxide-semiconductor field-effect transistor;
   a bistable circuit for controlling the switch, the switch being closed whilst the bistable circuit is set and open whilst the bistable circuit is reset;
   detection circuit for setting the bistable circuit in response to the voltage difference between the drain and source of the metal-oxide-semiconductor field-effect transistor being relatively greater than a first predefined voltage threshold; and
   a means for resetting the bistable circuit in response to the voltage difference between the drain and source of the metal-oxide-semiconductor field-effect transistor being relatively lesser than a second predetermined voltage threshold.

2. The protection circuit of claim 1, wherein the switch is selected from the group consisting of a metal-oxide-semiconductor field-effect transistor, a junction field-effect transistor, a bipolar transistor, and a silicon-controlled rectifier.

3. The protection circuit of claim 1, wherein the bistable is selected from the group consisting of a silicon-controlled rectifier, and a flip-flop.

* * * * *